US011092910B2

(12) United States Patent
Kamata et al.

(10) Patent No.: US 11,092,910 B2
(45) Date of Patent: Aug. 17, 2021

(54) SEMICONDUCTOR LIGHT-EMITTING DEVICE, EXPOSURE HEAD, AND IMAGE FORMING APPARATUS

(71) Applicant: CANON KABUSHIKI KAISHA, Tokyo (JP)

(72) Inventors: Yusuke Kamata, Tokyo (JP); Koichiro Nakanishi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/829,288

(22) Filed: Mar. 25, 2020

(65) Prior Publication Data
US 2020/0319582 A1    Oct. 8, 2020

(30) Foreign Application Priority Data
Apr. 2, 2019   (JP) .............................. JP2019-070387

(51) Int. Cl.
*G03G 15/04* (2006.01)
*G03G 15/32* (2006.01)
*H01L 33/00* (2010.01)
*H01L 33/58* (2010.01)

(52) U.S. Cl.
CPC . *G03G 15/04036* (2013.01); *G03G 15/04045* (2013.01); *G03G 15/04054* (2013.01); *G03G 15/323* (2013.01); *G03G 15/326* (2013.01); *H01L 33/0016* (2013.01); *H01L 33/58* (2013.01)

(58) Field of Classification Search
CPC ......... G03G 15/04036; G03G 15/0405; G03G 2215/0407; H01L 33/0016; H01L 33/58; H01L 33/10
See application file for complete search history.

(56) References Cited

U.S. PATENT DOCUMENTS

| | | | |
|---|---|---|---|
| 6,498,356 B1 * | 12/2002 | Sekiya | H01L 27/153 257/113 |
| 8,278,667 B2 * | 10/2012 | Murata | H01L 33/40 257/79 |
| 2007/0205426 A1 | 9/2007 | Inoshita et al. | |
| 2011/0079798 A1 | 4/2011 | Ogihara | |
| 2018/0062041 A1 | 3/2018 | Nakanishi | |
| 2018/0233534 A1 * | 8/2018 | Kondo | H01L 29/7412 |

FOREIGN PATENT DOCUMENTS

JP      09283801 A  * 10/1997
JP      2018-107420 A   7/2018

\* cited by examiner

*Primary Examiner* — Erika J Villaluna
(74) *Attorney, Agent, or Firm* — Venable LLP

(57) ABSTRACT

A semiconductor light-emitting device includes a semiconductor stacked structure including a light-emitting layer, a metal electrode provided over the semiconductor stacked structure and having an opening for externally emitting a light emitted from the light-emitting layer, and a transparent electrode provided over the semiconductor stacked structure inside the opening and over the metal electrode.

20 Claims, 11 Drawing Sheets

SEMICONDUCTOR LIGHT-EMITTING DEVICE, EXPOSURE HEAD, AND IMAGE FORMING APPARATUS

BACKGROUND OF THE INVENTION

Field of the Invention

The present invention relates to a semiconductor light-emitting device, an exposure head, and an image forming apparatus.

Description of the Related Art

As an exposure head used for forming a latent image on a photosensitive drum of an image forming apparatus, a surface light-emitting element array is used. In a typical configuration of such an exposure head, multiple plane light-emitting elements (light-emitting elements that emit light perpendicular to the primary face of a semiconductor substrate) are aligned in a certain direction, and a lens array is arranged in the same direction as the alignment direction of light-emitting elements. The light from the light-emitting elements are then captured as an image on the photosensitive drum through the lens. As a light-emitting element, an element formed of a light-emitting diode (LED) and an element formed of a light-emitting thyristor are known. In particular, a light-emitting device using a thyristor has an advantage of a reduced number of wirings and is suitable for an exposure head of a copy machine or the like.

Japanese Patent Application Laid-Open No. 2018-107420 discloses a self-scanning light-emitting element array using a surface light-emitting type of a light-emitting thyristor in which current is confined by using a tunnel junction between a transparent electrode and a highly doped contact layer. In the light-emitting thyristor disclosed in Japanese Patent Application Laid-Open No. 2018-107420, indium tin oxide (ITO) is used as the transparent electrode, and power is supplied to the transparent electrode from a metal electrode provided on the transparent electrode. That is, a light-emitting layer is caused to emit light by applying a forward bias voltage between the metal electrode and a backside electrode, and a light is emitted from the contact layer side via the transparent electrode.

However, the light-emitting thyristor disclosed in Japanese Patent Application Laid-Open No. 2018-107420 is configured such that the transparent electrode having a low thermal conductivity is in contact with the contact layer and has poor heat dissipation when the light-emitting thyristor generates heat due to continuous light emission or the like. Thus, during continuous light emission or the like, element characteristics or reliability may decrease due to an increase in the element temperature.

SUMMARY OF THE INVENTION

The present invention intends to provide a semiconductor light-emitting device, an exposure head, and an image forming apparatus having good heat dissipation.

According to one aspect of the present invention, provided is a semiconductor light-emitting device including a semiconductor stacked structure having a light-emitting layer, a metal electrode provided over the semiconductor stacked structure and having an opening for externally emitting a light emitted from the light-emitting layer, and a transparent electrode provided over the semiconductor stacked structure inside the opening and over the metal electrode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
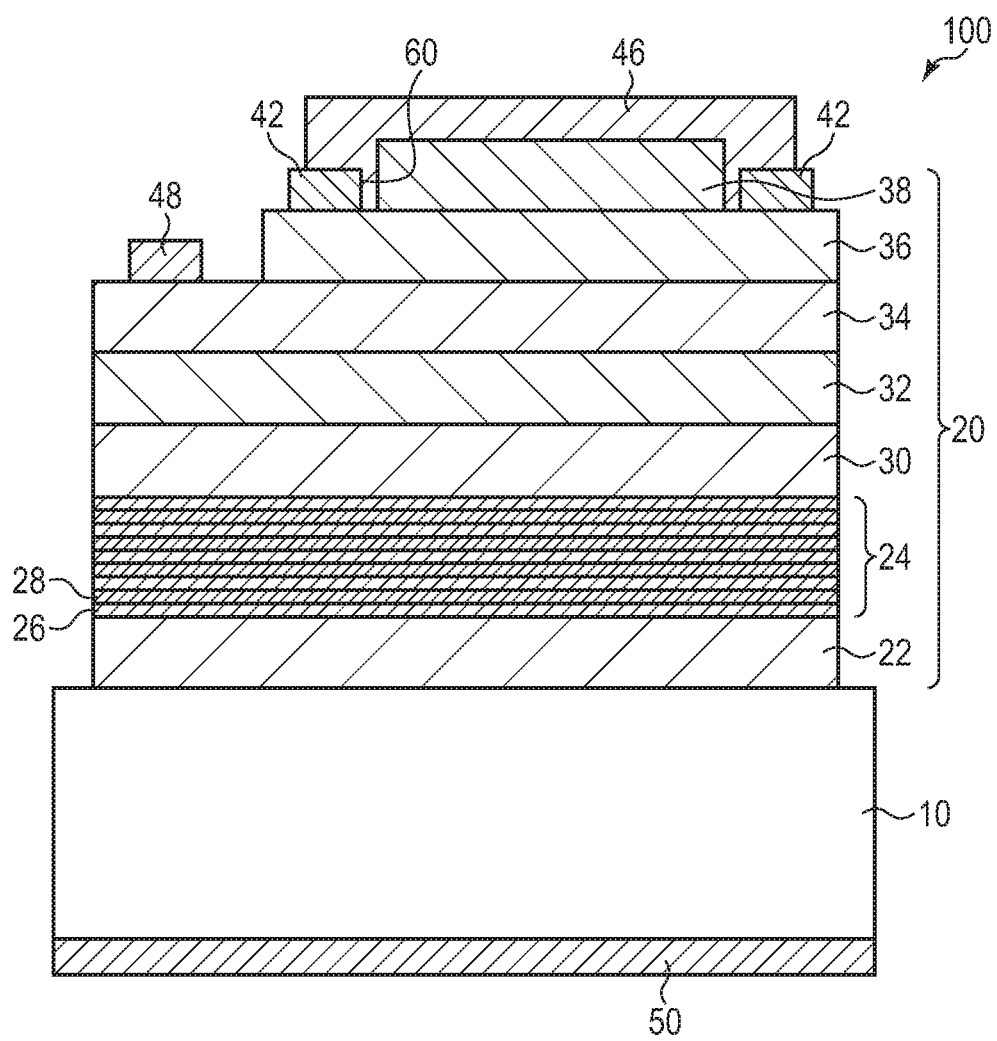
FIG. 1 is a schematic cross-sectional view illustrating the structure of a semiconductor light-emitting device according to a first embodiment of the present invention.
Figure 2:
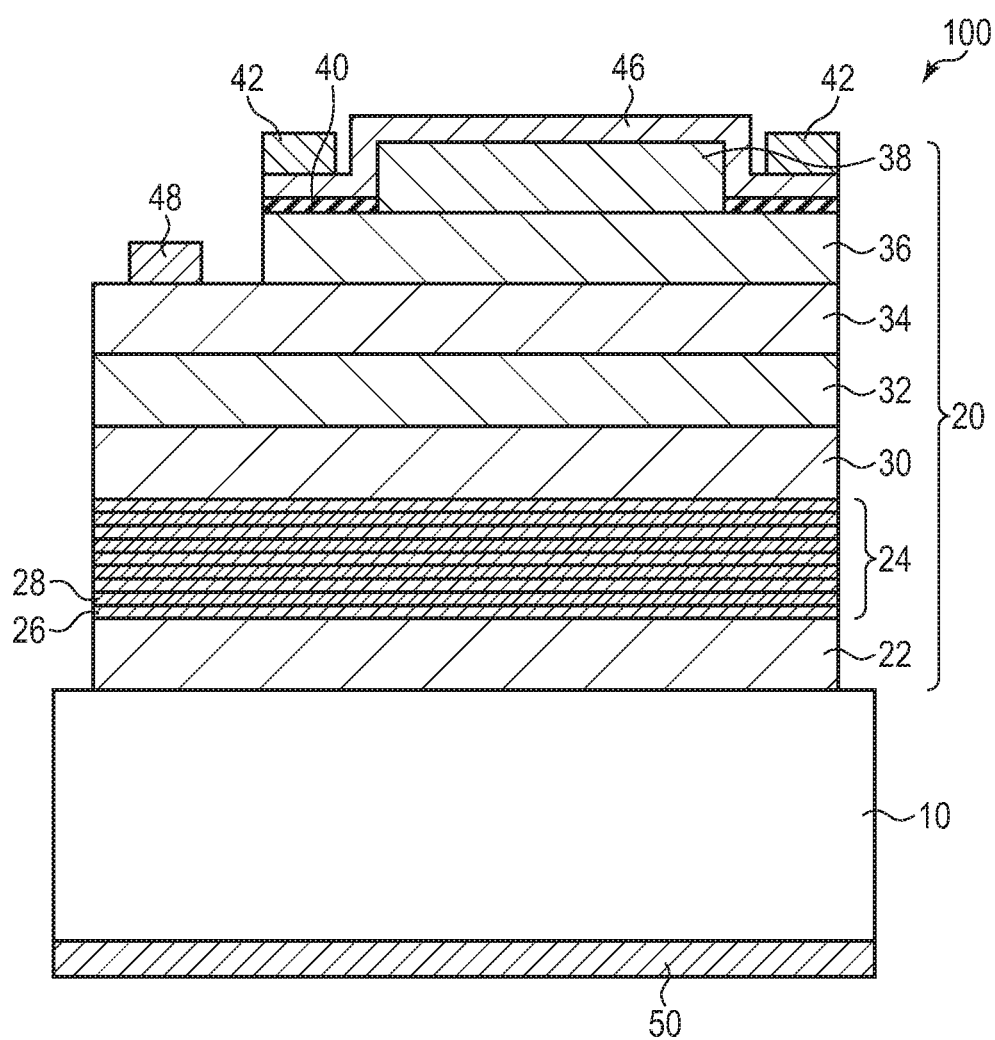
FIG. 2 is a schematic cross-sectional view illustrating the structure of a semiconductor light-emitting device according to a reference example.

A semiconductor light-emitting device according to a first embodiment of the present invention will be described with reference to FIG. 1 and FIG. 2. FIG. 1 is a schematic cross-sectional view illustrating the structure of the semiconductor light-emitting device according to the present embodiment. FIG. 2 is a schematic cross-sectional view illustrating the structure of a semiconductor light-emitting device according to a reference example.

As illustrated in FIG. 1, a semiconductor light-emitting device 100 according to the present embodiment includes a substrate 10 and a semiconductor stacked structure 20 provided over the substrate 10.

The substrate 10 is a semiconductor substrate of a first conductivity type. As the substrate 10, a group III-V compound semiconductor substrate such as a GaAs substrate, an InP substrate, or a GaP substrate may be used, for example.

The semiconductor stacked structure 20 is formed of a semiconductor layer 22, a distributed Bragg reflector layer 24, a semiconductor layer 30, a semiconductor layer 32, a semiconductor layer 34, a semiconductor layer 36, and a semiconductor layer 38 stacked in this order from the substrate 10 side. The distributed Bragg reflector layer (hereinafter, DBR layer) 24 has a stacked structure in which the semiconductor layer 26 of a low reflective index and the semiconductor layer 28 of a high reflective index are alternatingly and repeatedly stacked. Herein, the semiconductor layers 22, 26, 28, 30, and 34 are semiconductor layers of the first conductivity type, and the semiconductor layers 32, 36, and 38 are semiconductor layers of a second conductivity type that is different from the first conductivity type.

Each semiconductor layer forming the semiconductor stacked structure 20 is preferably formed of a group III-V compound semiconductor material. For example, it is preferable that a GaAs-based material, an AlGaAs-based material, a GaP-based material, a GaAsP-based material, an InP-based material, an AlAs-based material, or an AlGaInP-based material be used as a group III-V compound semiconductor. Among such materials, in terms of the light-emitting wavelength, it is preferable that each semiconductor layer forming the semiconductor stacked structure 20 contain a GaAs-based material or an AlGaAs-based material.

The semiconductor stacked structure 20 has thyristor structure (p-n-p-n structure or n-p-n-p structure) in which the semiconductor layers 22, 26, 28, and 30 of the first conductivity type, the semiconductor layer 32 of the second conductivity type, the semiconductor layer 34 of the first conductivity type, and the semiconductor layers 36 and 38 of the second conductivity type are stacked in this order. When the first conductivity type is the n-type, the second conductivity type is the p-type, and the semiconductor stacked structure 20 is a light-emitting thyristor having the n-type semiconductor layer, a p-type semiconductor layer, an n-type semiconductor layer, and a p-type semiconductor layer in this order from the substrate 10 side. When the first conductivity type is the p-type, the second conductivity type is the n-type, and the semiconductor stacked structure 20 is a light-emitting thyristor having a p-type semiconductor layer, an n-type semiconductor layer, a p-type semiconductor layer, and an n-type semiconductor layer in this order from the substrate 10 side.

The semiconductor layers 22, 26, 28, and 30 form the anode or the cathode of the light-emitting thyristor. The semiconductor layer 32 and the semiconductor layer 34 form the gate (or the base) of the light-emitting thyristor. The semiconductor layers 36 and 38 form the cathode or the anode of the light-emitting thyristor. When the first conductivity type is the n-type, the semiconductor layers 22, 26, 28, and 30 are the cathode, and the semiconductor layers 36 and 38 are the anode. When the first conductivity type is the p-type, the semiconductor layers 22, 26, 28, and 30 are the anode, and the semiconductor layers 36 and 38 are the cathode.

The semiconductor layers 36 and 38 are partially removed, and an electrode 48 is provided on the semiconductor layer 34 exposed by removing the semiconductor layers 36 and 38. Further, the semiconductor layer 38 is partially removed, and an electrode 42 is provided on the semiconductor layer 36 exposed by removing the semiconductor layer 38. The electrode 42 has a ring-shape pattern or a frame-shape pattern arranged to surround the circumference of the semiconductor layer 38 in plan view. In other words, the size of the semiconductor layer 38 is smaller than the size of an opening 60 provided in the electrode 42 in plan view, and the semiconductor layer 38 is located inside the opening 60. The light emitted by the light-emitting thyristor is externally emitted through the opening 60.

A transparent electrode 46 is provided on the electrode 42 and the semiconductor layer 38. An electrode 50 is provided on the backside opposite to a face of the substrate 10 on which the semiconductor stacked structure 20 is provided.

The semiconductor light-emitting device 100 may be formed of a combination of following materials, for example. The substrate 10 may be formed of an n-type GaAs substrate, for example. In general, n-type compound semiconductor substrates have higher quality than p-type compound semiconductor substrates, are widely distributed in the market, and are available at lower prices. Therefore, the use of an n-type compound semiconductor substrate is advantageous in that high-quality semiconductor light-emitting devices can be manufactured at low cost. The semiconductor layer 22 having a role as a buffer layer may be formed of an n-type GaAs layer or an n-type AlGaAs layer, for example.

As described above, the DBR layer 24 has a stacked structure in which the semiconductor layer 26 of a low reflective index and the semiconductor layer 28 of a high reflective index are alternatingly stacked. For example, the semiconductor layer 26 can be formed of an AlGaAs layer of low Al composition, and the semiconductor layer 28 can be formed of an AlGaAs layer of high Al composition. In such a case, for a combination of AlGaAs of the high Al composition and AlGaAs of the low Al composition, it is preferable that a difference of the Al compositions be larger because a reflection band can be wider. For example, a combination of an n-type $Al_{0.2}Ga_{0.8}As$ layer as the semiconductor layer 26 and an n-type $Al_{0.8}Ga_{0.2}As$ layer as the semiconductor layer 28 can be applied. Alternatively, a combination of an n-type $Al_{0.1}Ga_{0.9}As$ layer as the semiconductor layer 26 and an n-type $Al_{0.9}Ga_{0.1}As$ layer as the semiconductor layer 28 can be applied. Since a larger number of layers of the stacked semiconductor layers 26 and 28 allows for a higher reflectivity, it is preferable to stack 10 or more pairs, preferably, 20 or more pairs of the semiconductor layer 26 and the semiconductor layer 28.

The semiconductor layer 30 may be formed of an n-type AlGaAs layer having a film thickness of 600 nm, an Al composition of 25%, and a donor impurity concentration of $2 \times 10^{18}$ $cm^{-3}$, for example. The semiconductor layer 32 may be formed of a p-type AlGaAs layer having a film thickness of 700 nm, an Al composition of 15%, and an acceptor impurity concentration of $3 \times 10^{17}$ $cm^{-3}$, for example. The semiconductor layer 34 may be formed of an n-type AlGaAs layer having a film thickness of 350 nm, an Al composition of 15%, and a donor impurity concentration of $3 \times 10^{18}$ $cm^{-3}$, for example. The semiconductor layer 36 may be formed of a p-type AlGaAs layer having a film thickness of 320 nm, an Al composition of 30%, and an acceptor impurity concentration of $2 \times 10^{17}$ $cm^{-3}$, for example. The semiconductor layer 38 having a role as a contact layer may be formed of a p-type AlGaAs layer having a film thickness of 200 nm, an Al composition of 30%, and an acceptor impurity concentration of $7 \times 10^{19}$ $cm^{-3}$, for example.

The electrodes 42 and 48 may be formed of a metal electrode in which Cr and Au are stacked in this order, for example. An electrode 50 may be formed of a metal electrode in which AuGe, Ni, and Au are stacked in this order, for example.

The transparent electrode 46 is transparent to the light-emitting wavelength of a light-emitting thyristor L and is formed of a high-conductivity material. Note that "transparent to the light-emitting wavelength of a light-emitting thyristor L" as used herein means that a light emitted by the light-emitting thyristor L has a transmittance of 70% or higher at the center wavelength $\lambda$. Further, it is preferable that the thickness of the transparent electrode 46 be an odd multiple of $\lambda/4\pm10\%$ of the optical length in the thickness direction of the transparent electrode 46. By forming the thickness of the transparent electrode 46 as described above, reflection of a light emitted from the light-emitting thyristor L in the transparent electrode 46 can be reduced, and light extraction efficiency can be increased.

While a material of the transparent electrode 46 is not particularly limited, it is preferable to use transparent conductivity oxide (TCO). As transparent conductivity oxide, an indium oxide-based material having an n-type electrical conduction property such as an indium tin oxide-based material (ITO), an indium zinc oxide-based material (IZO), or an indium tungsten oxide-based material (IWO) may be used. Alternatively, as the transparent conductivity oxide, a zinc oxide-based material such as an aluminum zinc oxide-based material (AZO) or a gallium zinc oxide-based material (GZO), a tin oxide-based material, or the like having an n-type electrical conduction property may be used. Further, when the first conductivity type is the p-type, a nickel oxide-based material, a copper oxide-based material, or the like having a p-type electrical conduction property may be used as the transparent conductivity oxide.

Herein, before describing the effect and advantage achieved by the semiconductor light-emitting device according to the present embodiment, a semiconductor light-emitting device according to a reference example and a problem thereof will be described with reference to FIG. 2. FIG. 2 is a schematic cross-sectional view illustrating the structure of the semiconductor light-emitting device according to the reference example. The same components as those of the semiconductor light-emitting device according to the present embodiment are labeled with the same references, and the description thereof will be omitted or simplified.

The semiconductor light-emitting device according to the reference example illustrated in FIG. 2 is the same as the semiconductor light-emitting device according to the present embodiment described above except for a difference in an electrical connection form between the electrode 42 and the semiconductor layer 36.

In the semiconductor light-emitting device according to the reference example, the semiconductor layer 38 is partially removed as with the case of the semiconductor light-emitting device according to the present embodiment. An insulating layer 40 is provided on the semiconductor layer 36 exposed by removing the semiconductor layer 38. The transparent electrode 46 is provided on the insulating layer 40. The transparent electrode 46 extends over the insulating layer 40 to the semiconductor layer 38. The electrode 42 is provided on the transparent electrode 46 in the region in which the insulating layer 40 is provided. That is, in the semiconductor light-emitting device according to the reference example, the current supplied from the electrode 42 flows to the semiconductor layer 36 provided under the semiconductor layer 38 through the electrode 42, the transparent electrode 46, and the semiconductor layer 38.

When the semiconductor stacked structure 20 generates heat due to continuous light emission of the semiconductor light-emitting device, the heat generated inside the semiconductor stacked structure 20 reaches the electrode 42 through the transparent electrode 46. The heat reaching the electrode 42 is transferred and dissipated through a wiring (not illustrated) connected to the electrode 42. Further, while a part of heat is dissipated from the electrode 50 through the substrate 10, since the substrate 10 is significantly thicker than the semiconductor stacked structure 20 and has a larger thermal resistance, heat dissipation from the electrode 50 is insufficient. Further, the heat conductivity of ITO that is generally used as the transparent electrode 46 is 4 to 10 [W/m·K], which is significantly smaller than 320 [W/m·K] that is the heat conductivity of Au. Thus, the heat generated inside the semiconductor stacked structure 20 is not sufficiently dissipated externally through the transparent electrode 46.

Thus, the semiconductor light-emitting device according to the reference example does not have sufficient heat dissipation performance, and this may cause a rise in the temperature during continuous light emission and a reduction in element characteristics or reliability due to the rise in the temperature.

On the other hand, in the semiconductor light-emitting device according to the present embodiment, the electrode 42 is provided on the semiconductor layer 36, and the transparent electrode 46 is provided on the semiconductor layer 38 and the electrode 42.

In the semiconductor light-emitting device according to the present embodiment, the impurity concentration of each layer of the semiconductor layers 30, 32, 34, and 36 is appropriately set taking the thyristor operation as a light-emitting thyristor into consideration. Thus, in general, it is not possible to set the impurity concentration of the semiconductor layer 36 to be high enough to form an ohmic contact with the metal electrode. As a result, in the semiconductor light-emitting device according to the present embodiment, the contact resistance is high between the semiconductor layer 36 and the electrode 42.

However, the uppermost layer of the semiconductor stacked structure 20, that is, the semiconductor layer 38 as a contact layer is provided on the semiconductor layer 36 to sufficiently increase the impurity concentration of the semiconductor layer 38, and thereby a tunnel junction is formed between the semiconductor layer 38 and the transparent electrode 46. Thereby, an electrical path having a low resistance can be formed between the semiconductor layer 38 and the transparent electrode 46. That is, rather than directly flowing from the electrode 42 to the semiconductor layer 36, the current supplied from the electrode 42 intensively flows from the electrode 42 to the underlying semiconductor layer 36 through the transparent electrode 46, the tunnel junction between the transparent electrode 46 and the semiconductor layer 38, and the semiconductor layer 38.

Therefore, according to the above configuration of the present embodiment, it is possible to cause the current supplied from the electrode 42 to flow intensively from the semiconductor layer 38 to the semiconductor layer 36, which enables intensive light emission below the semiconductor layer 38. Since a light generated below the semiconductor layer 38 is not blocked by the electrode 42, usage efficiency of light can be improved.

Further, since the electrode 42 is arranged below the transparent electrode 46, the heat generated below the semiconductor layer 38 is directly transferred to the electrode 42 formed of a metal material having a high heat conductivity without passing through the transparent electrode 46. That is, the heat generated below the semiconductor layer 38 is efficiently transferred from the electrode 42 having a high heat conductivity to a wiring (not illustrated) and is efficiently dissipated to the outside.

Therefore, according to the above configuration of the present embodiment, heat dissipation performance of the semiconductor light-emitting device can be improved, and this may suppress a rise in the temperature during continuous light emission and a reduction in element characteristics or reliability due to the rise in the temperature.

Second Embodiment

A semiconductor light-emitting device according to a second embodiment of the present invention will be described with reference to FIG. 3. The same components as those of the semiconductor light-emitting device according to the first embodiment are labeled with the same references, and the description thereof will be omitted or simplified.

Figure 3:
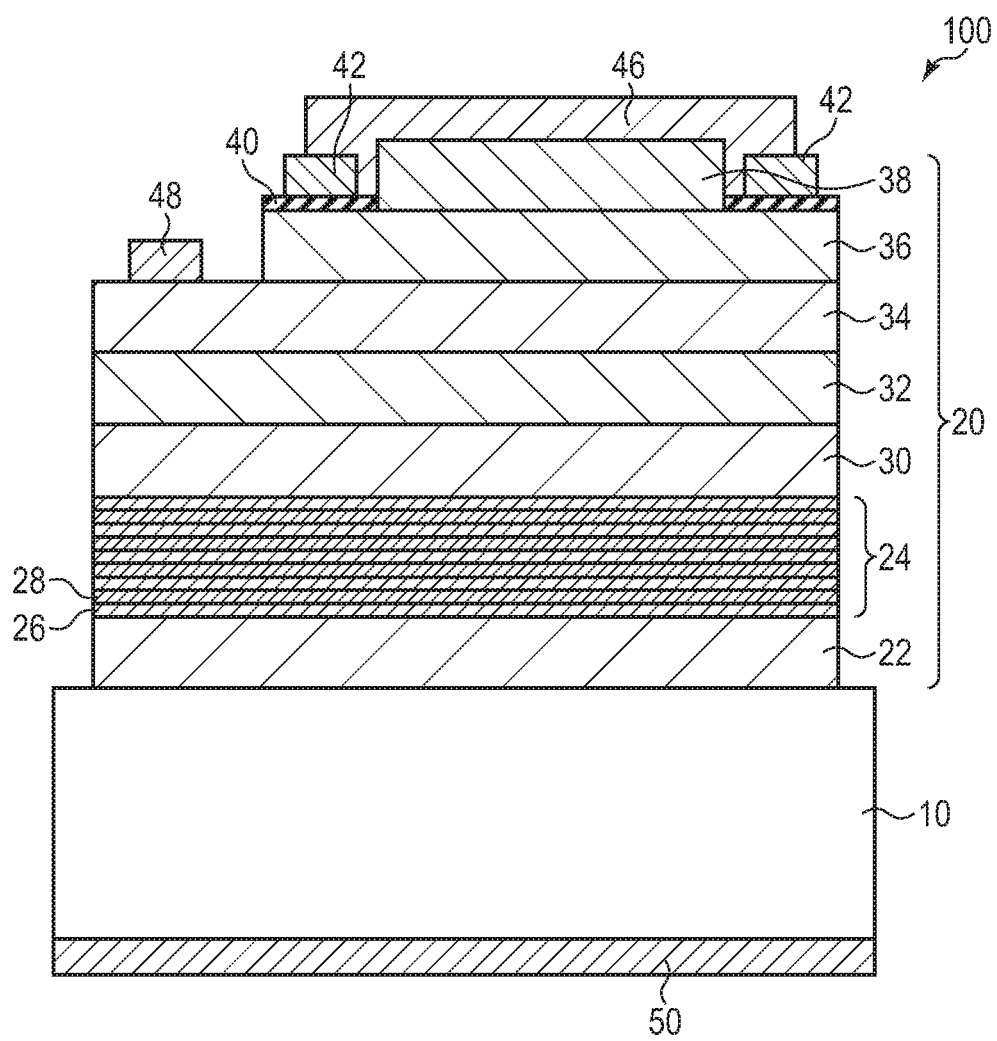
FIG. 3 is a schematic cross-sectional view illustrating the structure of a semiconductor light-emitting device according to a second embodiment of the present invention.

FIG. 3 is a schematic cross-sectional view illustrating the structure of the semiconductor light-emitting device according to the present embodiment. As illustrated in FIG. 3, the semiconductor light-emitting device 100 according to the present embodiment is the same as the semiconductor light-emitting device according to the first embodiment except that the insulating layer 40 is provided between the semiconductor layer 36 and the electrode 42.

To enable efficient light emission of the region where light generated from the semiconductor stacked structure 20 is not blocked by the electrode 42, it is desirable to reduce the current flowing through the interface between the electrode 42 and the semiconductor layer 36. In the semiconductor light-emitting device according to the first embodiment, a Schottky junction is formed between the electrode 42 and the semiconductor layer 36, and the contact resistance is high.

In the semiconductor light-emitting device according to the present invention, however, a light-emitting thyristor is assumed as an example, and it is necessary to temporarily apply a voltage that is higher than a drive voltage for switching the thyristor. Specifically, when a thyristor is turned on, the voltage applied to the electrode 42 temporarily reaches the voltage (breakover voltage) that is higher than the control voltage.

When such a high voltage is applied to the electrode 42, the current also flows from the electrode 42 to the underlying semiconductor layer 36, and ineffective light, which is not effective light blocked by the electrode 42, may increase. Further, in a light-emitting element other than a light-emitting thyristor, the impurity concentration of a semiconductor layer below an electrode may be high, or a contact resistance between an electrode and a semiconductor layer may be low. Therefore, in terms of preventing current from flowing from the electrode 42 to the underlying semiconductor layer 36, it is desirable to provide the insulating layer 40 between the semiconductor layer 36 and the electrode 42.

As described above, according to the present embodiment, heat dissipation performance of the semiconductor light-emitting device can be improved, and this may suppress a rise in the temperature during continuous light emission and a reduction in element characteristics or reliability due to the rise in the temperature. Further, according to the above configuration of the present embodiment, it is possible to prevent current from flowing from the electrode 42 to the underlying semiconductor layer 36, a current concentrating region can be more efficiently narrowed, and usage efficiency of light can be improved. Further, a semiconductor light-emitting device having tolerance to a high voltage can be realized.

Third Embodiment

A semiconductor light-emitting device according to a third embodiment of the present invention will be described with reference to FIG. 4. The same components as those of the semiconductor light-emitting device according to the first and second embodiments are labeled with the same references, and the description thereof will be omitted or simplified.

Figure 4:
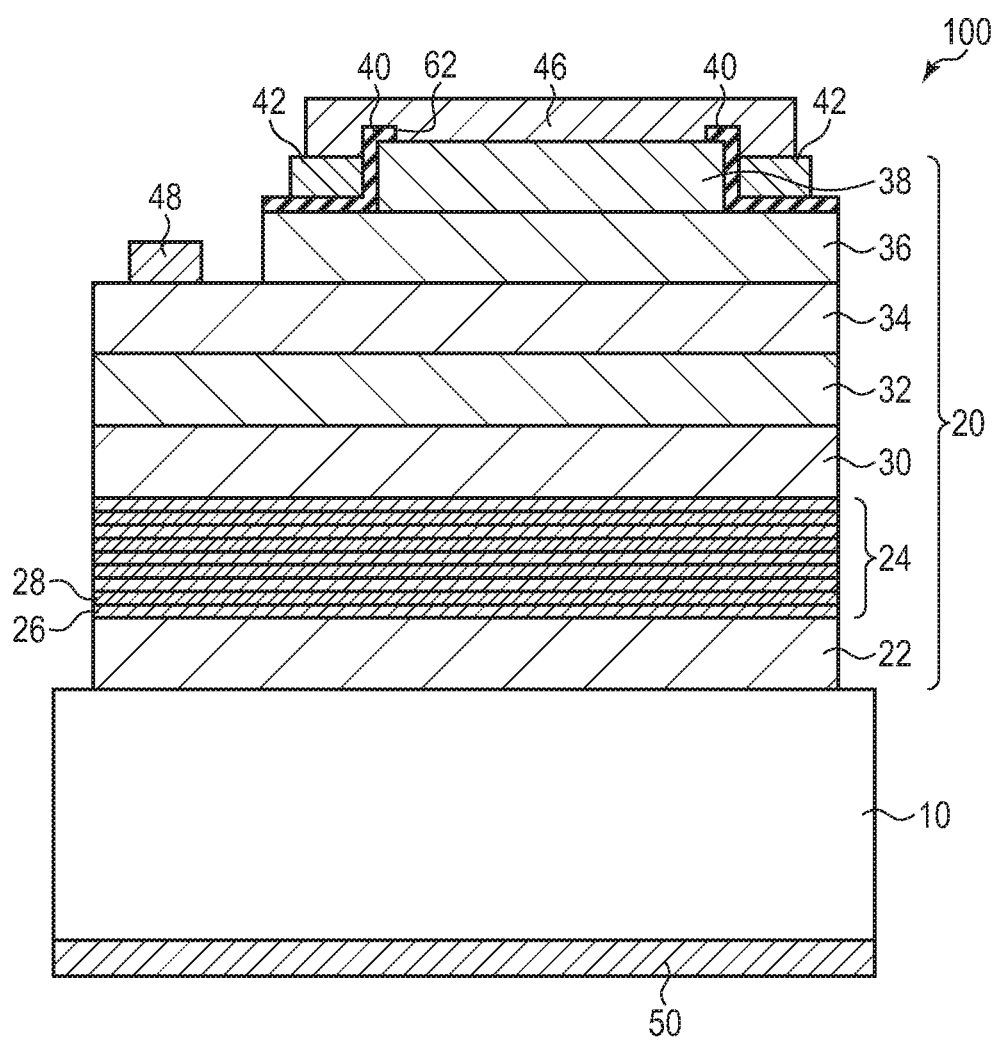
FIG. 4 is a schematic cross-sectional view illustrating the structure of a semiconductor light-emitting device according to a third embodiment of the present invention.

FIG. 4 is a schematic cross-sectional view illustrating the structure of the semiconductor light-emitting device according to the present embodiment. As illustrated in FIG. 4, the semiconductor light-emitting device 100 according to the present embodiment is the same as the semiconductor light-emitting device according to the second embodiment except that the insulating layer 40 provided between the semiconductor layer 36 and the electrode 42 extends to the edge part of the upper face of the semiconductor layer 38. In other words, the insulating layer 40 has an opening 62 above the semiconductor layer 38, and the size of the opening 62 is smaller than the size of the semiconductor layer 38 in plan view. The semiconductor layer 38 and the transparent electrode 46 are in contact with each other inside the opening 62.

In the configuration of the second embodiment, it is necessary to precisely align an opening of the insulating layer 40 (the region in which the insulating layer 40 is absent) and the semiconductor layer 38. When misalignment between the opening of the insulating layer 40 and the semiconductor layer 38 occurs, a place where the semiconductor layer 36 is not covered with the insulating layer 40 occurs, and the withstand pressure between the electrode 42 and the semiconductor layer 36 may decrease. Further, when alignment between the opening of the insulating layer 40 and the semiconductor layer 38 is performed at high accuracy, an increase in the manufacturing cost is unavoidable.

In this regard, in the semiconductor light-emitting device according to the present embodiment, the insulating layer 40 is formed to cover the edge part of the semiconductor layer 38. Therefore, even when misalignment between the opening of the insulating layer 40 and the semiconductor layer 38 occurs, the semiconductor layer 36 is not exposed in the opening of the insulating layer 40.

Therefore, according to the above configuration of the present embodiment, the semiconductor layer 36 and the electrode 42 can be reliably insulated, and the reliability of the semiconductor light-emitting device can be improved.

The width at which the insulating layer 40 covers the edge part of the semiconductor layer 38 is appropriately set taking the alignment accuracy of photolithography into consideration. In the present embodiment, as an example, the width at which the insulating layer 40 covers the edge part of the semiconductor layer 38 is 0.5 μm.

As described above, according to the present embodiment, heat dissipation performance of the semiconductor light-emitting device can be improved, and this may suppress a rise in the temperature during continuous light emission or a reduction in element characteristics or reliability due to the rise in the temperature. Further, according to the above configuration of the present embodiment, it is possible to prevent current from flowing from the electrode 42 to the underlying semiconductor layer 36, a current concentrating region can be efficiently narrowed, and usage efficiency of light can be improved. Further, a semiconductor light-emitting device having tolerance to a high voltage can be realized.

Fourth Embodiment

A semiconductor light-emitting device according to a fourth embodiment of the present invention will be described with reference to FIG. 5. The same components as those of the semiconductor light-emitting device according to the first to third embodiments are labeled with the same references, and the description thereof will be omitted or simplified.

Figure 5:
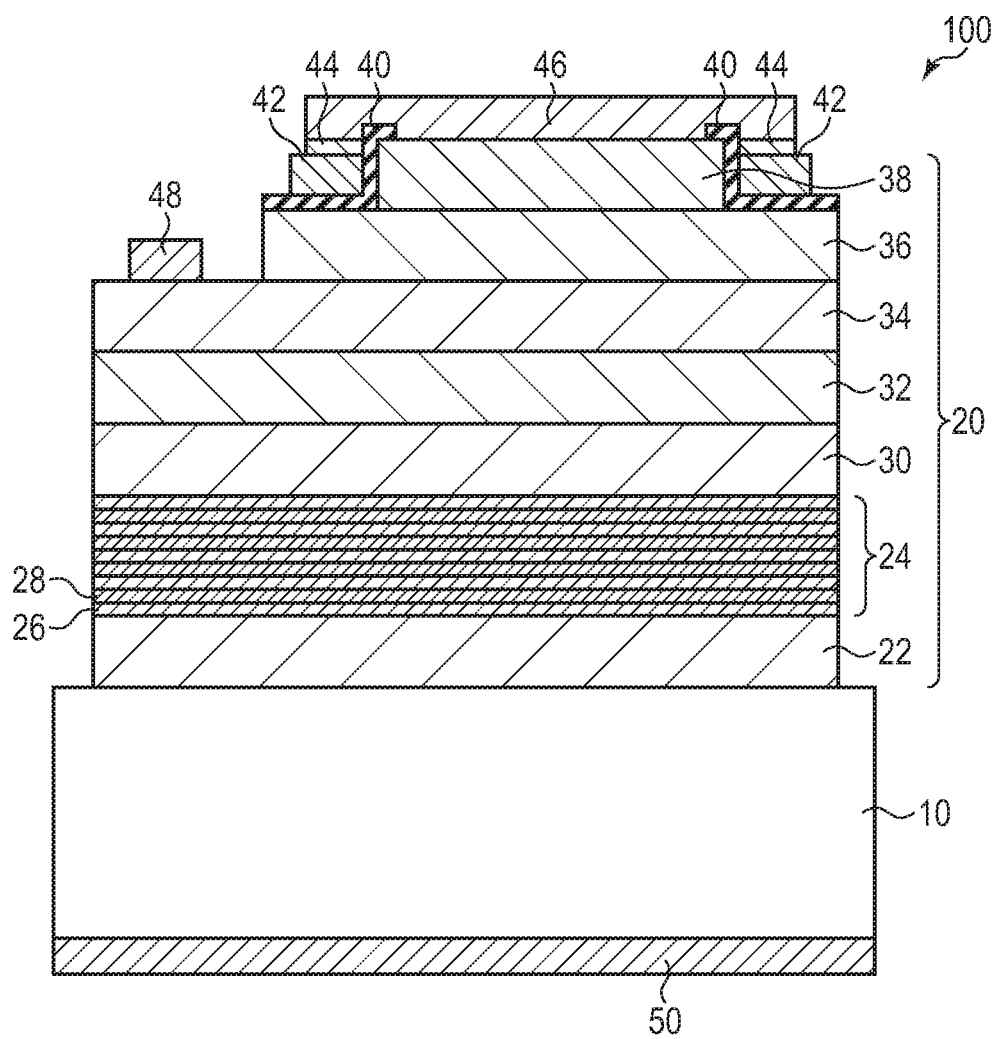
FIG. 5 is a schematic cross-sectional view illustrating the structure of a semiconductor light-emitting device according to a fourth embodiment of the present invention.

FIG. 5 is a schematic cross-sectional view illustrating the structure of the semiconductor light-emitting device according to the present embodiment. As illustrated in FIG. 5, the semiconductor light-emitting device 100 according to the present embodiment is the same as the semiconductor light-emitting device according to the third embodiment except that an adhesion layer 44 is provided between the electrode 42 and the transparent electrode 46.

In general, a transparent electrode material that is an oxide conductive material has poor adhesion with a metal material used for the electrode 42. Thus, the transparent electrode 46 may peel off at the interface with the electrode 42 after the transparent electrode 46 is formed.

In terms of the above, in the semiconductor light-emitting device according to the present embodiment, the adhesion layer 44 is provided between the electrode 42 and the transparent electrode 46. Accordingly, adhesion between the electrode 42 and the transparent electrode 46 can be improved, and the reliability of the semiconductor light-emitting device can be improved.

A material forming the adhesion layer 44 is not particularly limited as long as a material can improve adhesion between the electrode 42 and the transparent electrode 46 and has good conductivity. As the adhesion layer 44, for example, titanium (Ti), chromium (Cr), nickel (Ni), an alloy containing two or more of these metals, oxide of Ti, Cr, or Ni or the alloy, or the like may be applied.

Note that, while an example in which the adhesion layer 44 is provided between the electrode 42 and the transparent electrode 46 of the semiconductor light-emitting device according to the third embodiment is described in the present embodiment, the adhesion layer 44 may be provided between the electrode 42 and the transparent electrode 46 of the semiconductor light-emitting device according to the first or second embodiment.

As described above, according to the present embodiment, heat dissipation performance of the semiconductor light-emitting device can be improved, and this may suppress an increase in the element temperature during continuous light emission or a reduction in element characteristics or reliability due to the rise in the temperature. Further, according to the above configuration of the present embodiment, adhesion between the electrode 42 and the transparent electrode 46 can be improved, and the semiconductor light-emitting device that has higher reliability can be realized.

Fifth Embodiment

A semiconductor light-emitting device according to a fifth embodiment of the present invention will be described with reference to FIG. 6 to FIG. 8. The same components as those of the semiconductor light-emitting device according to the first to fourth embodiments are labeled with the same references, and the description thereof will be omitted or simplified.

The present embodiment describes a self-scanning light-emitting device (SLED) using the semiconductor light-emitting device according to the first to fourth embodiments. While the self-scanning light-emitting device may be a device using a light-emitting diode (LED) or a vertical cavity surface emitting laser (VCSEL), a light-emitting device using a thyristor has an advantage of a reduced number of wirings and is suitable for an exposure head of a copy machine or the like. In a self-scanning light-emitting device, the shift thyristors are coupled by the transfer diode, thereby a potential gradient is formed between the gates of the shift thyristors, and a self-scanning function is realized by using a threshold voltage difference between the shift thyristors.

Figure 6:
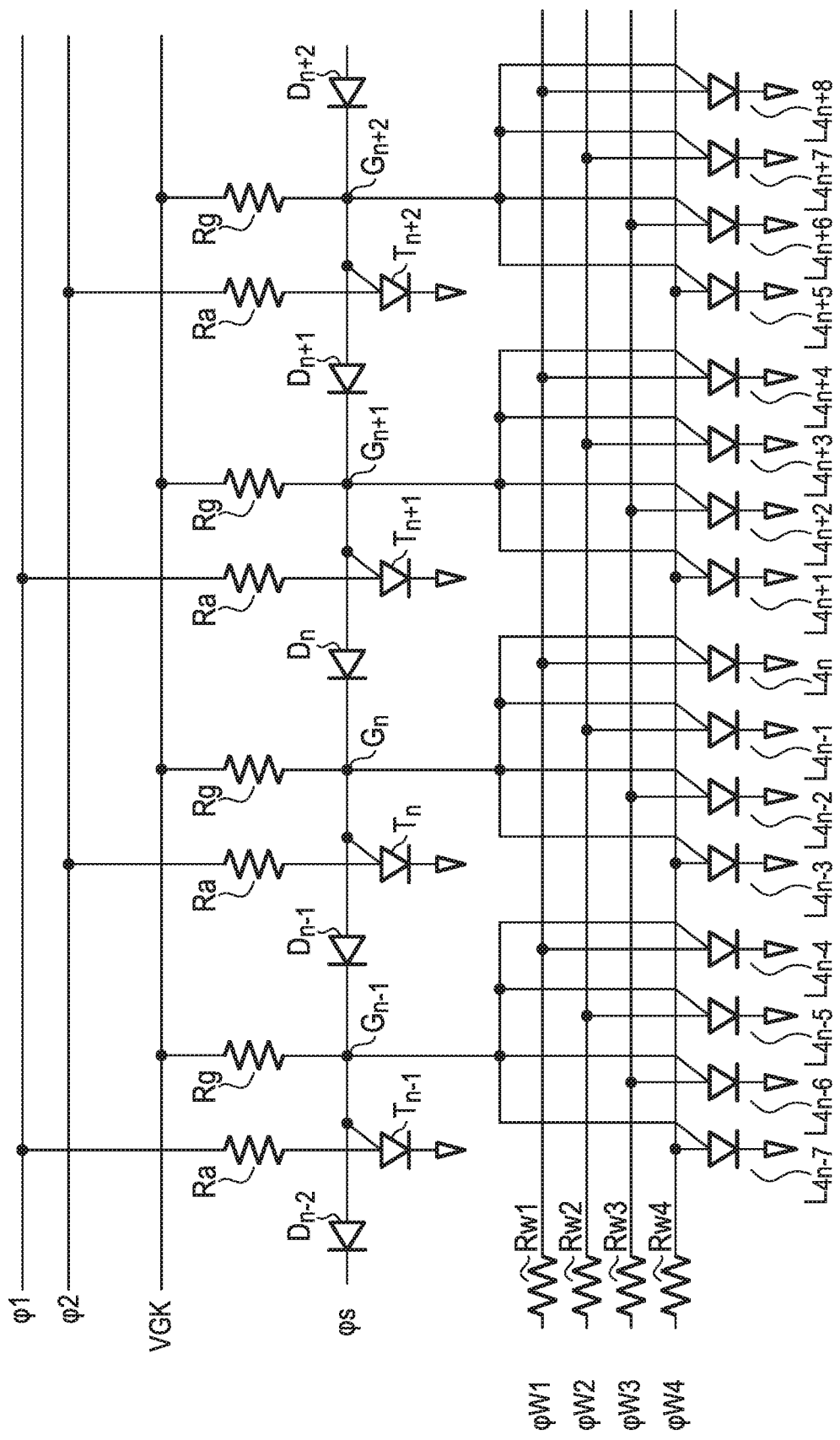
FIG. 6 is an equivalent circuit diagram illustrating a general configuration of a semiconductor light-emitting device according to a fifth embodiment of the present invention.

FIG. 6 is an equivalent circuit diagram illustrating a self-scanning circuit of a semiconductor light-emitting device according to the present embodiment. In FIG. 6, four shift thyristors $T_{n-1}$ to $T_{n+2}$ out of a self-scanning circuit forming the semiconductor light-emitting device are illustrated as a plurality of shift thyristors T. Further, 16 light-emitting thyristors $L_{4n-7}$ to $L_{4n+8}$ are illustrated as a plurality of light-emitting thyristors L. Further, five transfer diodes $D_{n-2}$ to $D_{n+2}$ are illustrated as a plurality of transfer diodes D. However, the number of shift thyristors T, the number of the light-emitting thyristors L, and the number of transfer diodes D may be selected as appropriate in accordance with the size or the like of a semiconductor light-emitting device. The index "n" is an integer greater than or equal to two.

Each of the light-emitting thyristors L may be formed of the semiconductor light-emitting device described in any of the first to fourth embodiments. Each of shift thyristors T may be formed of the same thyristor structure as the light-emitting thyristor L. Each of the transfer diodes D is not particularly limited and can be formed of a part of the semiconductor layer out of the semiconductor layer forming a thyristor, for example, a p-n junction between the semiconductor layer 34 and the semiconductor layer 36.

The transfer diodes $D_{n-2}$ to $D_{n+2}$ are connected in series so that the anode and the cathode of an adjacent transfer diode D are connected to each other. That is, the anode of the transfer diode $D_{n-2}$ is connected to the cathode of the transfer diode $D_{n-1}$, and the anode of the transfer diode $D_{n-1}$ is connected to the cathode of the transfer diode $D_n$. Further, the anode of the transfer diode $D_n$ is connected to the cathode of the transfer diode $D_{n+1}$, and the anode of the transfer diode $D_{n+1}$ is connected to the cathode of the transfer diode $D_{n+2}$. The series-connected circuit formed of the plurality of transfer diodes $D_{n-2}$ to $D_{n+2}$ forms a start signal line to which a start signal Φs is supplied. The start signal Φs is supplied from the end of the cathode side of the series-connected circuit.

Each of the connection nodes between adjacent transfer diodes D is connected via a gate resistor Rg to a gate line to which a power supply voltage VGK is supplied. Further, the gate of one shift thyristor T and the gates of four light-emitting thyristors L are connected to each of the connection nodes between adjacent transfer diodes D. That is, the gate of the shift thyristor $T_{n-1}$ and the gates of the light-emitting thyristors $L_{4n-7}$ to $L_{4n-4}$ are connected to the connection node between the transfer diode $D_{n-2}$ and the transfer diode $D_{n-1}$ (a common gate $G_{n-1}$). The gate of the shift thyristor $T_n$ and the gates of the light-emitting thyristors $L_{4n-3}$ to $L_{4n}$ are connected to the connection node between the transfer diode $D_{n-1}$ and the transfer diode $D_n$ (a common gate $G_n$).

The gate of the shift thyristor $T_{n+1}$ and the gates of the light-emitting thyristors $L_{4n+1}$ to $L_{4n+4}$ are connected to the connection node between the transfer diode $D_n$ and the transfer diode $D_{n+1}$ (a common gate $G_{n+1}$). The gate of the shift thyristor $T_{n+2}$ and the gates of the light-emitting thyristors $L_{4n+5}$ to $L_{4n+8}$ are connected to the connection node between the transfer diode $D_{n+1}$ and the transfer diode $D_{n+2}$ (a common gate $G_{n+2}$).

The anodes of odd-numbered shift thyristors T (for example, the shift thyristors $T_{n-1}$, $T_{n+1}$) are connected to a transfer signal line to which a transfer signal $\Phi1$ is supplied via an input resistor Ra. The anodes of even-numbered shift thyristors T (for example, the shift thyristors $T_n$, $T_{n+2}$) are connected to a transfer signal line to which a transfer signal $\Phi2$ is supplied via an input resistor Ra.

The anode of the light-emitting thyristor L is connected to a predetermined lighting signal line to which a lighting signal $\Phi W$ is supplied via a resistor Rw. That is, the anodes of the light-emitting thyristors $L_{4n-7}$, $L_{4n-3}$, $L_{4n+1}$, and $L_{4n+5}$ are connected to a lighting signal line to which a lighting signal $\Phi W4$ is supplied via a resistor Rw4. The anodes of the light-emitting thyristors $L_{4n-6}$, $L_{4n-2}$, $L_{4n+2}$, and $L_{4n+6}$ are connected to a lighting signal line to which a lighting signal $\Phi W3$ is supplied via a resistor Rw3. The anodes of the light-emitting thyristors $L_{4n-5}$, $L_{4n-1}$, $L_{4n+3}$, and $L_{4n+7}$ are connected to a lighting signal line to which a lighting signal $\Phi W2$ is supplied via a resistor Rw2. The anodes of the light-emitting thyristors $L_{4n-4}$, $L_{4n}$, $L_{4n+4}$, and $L_{4n+8}$ are connected to a lighting signal line to which a lighting signal $\Phi W1$ is supplied via a resistor Rw1.

Next, a transfer operation in an on-state of the shift thyristor T in the semiconductor light-emitting device 100 according to the present embodiment will be described with reference to FIG. 6 to FIG. 7C. In this example, the power supply voltage VGK supplied to the gate line is 5 V, and the transfer signals $\Phi1$ and $\Phi2$ supplied to the transfer signal lines are at either 0 V or 5 V.

Figure 7A:
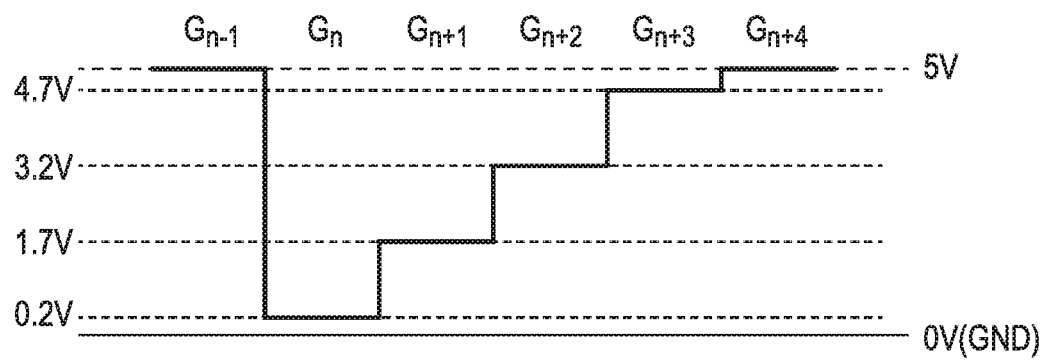
FIG. 7A, FIG. 7B, and FIG. 7C are diagrams illustrating a transfer operation in an on-state of a shift thyristor in the semiconductor light-emitting device according to the fifth embodiment of the present invention.
Figure 7B:
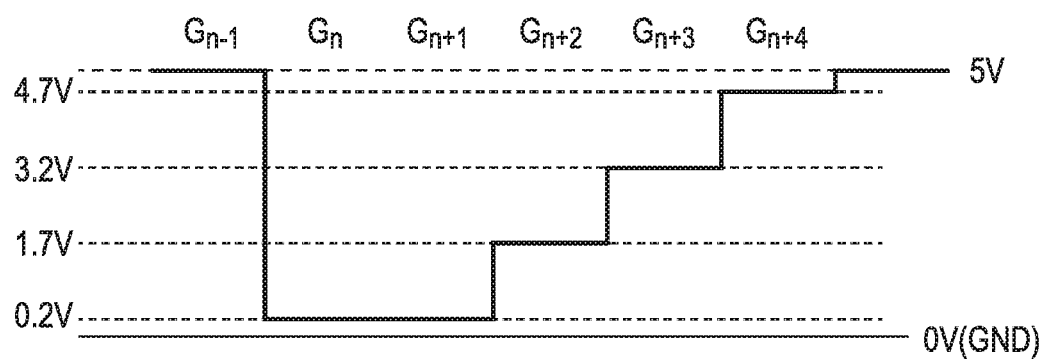
Figure 7C:
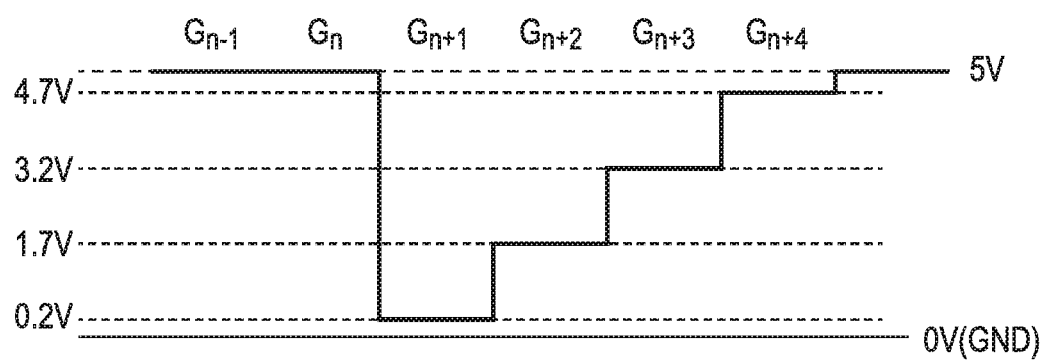

FIG. 7A to FIG. 7C are diagrams illustrating the transfer operation in the on-state of shift thyristors in the semiconductor light-emitting device according to the present embodiment.

FIG. 7A illustrates a distribution of the potentials of the common gates $G_{n-1}$ to $G_{n+4}$ when the transfer signal $\Phi1$ is at 0 V, the transfer signal $\Phi2$ is at 5V, and the shift thyristor $T_n$ is in the on-state. Note that the common gates $G_{n+3}$ and $G_{n+4}$ are common gates that are on the post-stage of the common gate $G_{n+2}$ and are not illustrated in FIG. 1.

When the shift thyristor $T_n$ is in the on-state, the potential of the common gate $G_n$ connected to the gate of the shift thyristor $T_n$ and the gates of the light-emitting thyristors $L_{4n-3}$ to $L_{4n}$ decreases to around 0.2 V. A potential difference that is substantially the same as a diffusion potential of the transfer diode $D_n$ that connects the common gate $G_n$ to the common gate $G_{n+1}$ occurs between the common gate $G_n$ and the common gate $G_{n+1}$. In the present embodiment, the diffusion potential of the transfer diode $D_n$ is around 1.5 V, and the potential of the common gate $G_{n+1}$ is 1.7 V that is an addition of 0.2 V, which is the potential of the common gate $G_n$, and 1.5V, which is the diffusion potential of the transfer diode $D_n$. Similarly, the potential of the common gate $G_{n+2}$ is 3.2 V, and the potential of the common gate $G_{n+3}$ (not illustrated) is 4.7 V.

Here, since the upper limit voltage of the common gate G is the power supply voltage VGK, the potential of the common gate $G_{n+4}$ and the post-stage thereof is 5 V that is the value of the power supply voltage VGK. Further, since the transfer diode D between the common gate $G_n$ and the common gate $G_{n-1}$ is reverse-biased, the power supply voltage VGK is directly supplied to the common gate $G_{n-1}$. The same applies for the common gate G on the pre-stage of the common gate $G_{n-1}$. That is, the potential of the common gate $G_{n-1}$ or the like on the pre-stage of the common gate $G_n$ is 5 V that is the value of the power supply voltage VGK. In such a way, the potential gradient as illustrated in FIG. 7A is formed in the common gates $G_n$ to $G_{n+3}$.

A voltage (threshold voltage) required to turn on the shift thyristor T is substantially the same as a voltage that is an addition of the gate potential and the diffusion potential. When the shift thyristor $T_n$ is turned on, the shift thyristor having the lowest gate potential in other shift thyristors T connected to the transfer signal line to which the transfer signal $\Phi2$ is supplied is the shift thyristor $T_{n+2}$. The potential of the common gate $G_{n+2}$ corresponding to the shift thyristor $T_{n+2}$ is 3.2 V as described above, and the threshold voltage of the shift thyristor $T_{n+2}$ is 4.7 V.

However, because the shift thyristor $T_n$ is in the on-state, the potential of the transfer signal line to which the transfer signal $\Phi2$ is supplied has decreased to the voltage corresponding to the diffusion potential (around 1.5 V). Thus, the potential of the transfer signal line to which the transfer signal $\Phi2$ is supplied is lower than the threshold voltage of the shift thyristor $T_{n+2}$, and the shift thyristor $T_{n+2}$ is unable to be turned on. All the other shift thyristors T connected to the same transfer signal line have higher threshold voltages than the shift thyristor $T_{n+2}$ and thus are unable to be turned on as with the shift thyristor $T_{n+2}$. As a result, only the shift thyristor $T_n$ can be maintained in the on-state.

FIG. 7B illustrates a distribution of the potentials of the common gates $G_{n-1}$ to $G_{n+4}$ when the transfer signal $\Phi1$ is changed to 5 V from the state of FIG. 7A.

When the shift thyristor T connected to the transfer signal line to which the transfer signal $\Phi1$ is supplied is focused on, the threshold voltage of the shift thyristor $T_{n+1}$ in a state of the lowest threshold voltage is 3.2 V. The threshold voltage of the shift thyristor $T_{n+3}$ in a state of the next lowest threshold voltage is 6.2 V. Therefore, when the transfer signal $\Phi1$ is changed from 0 V to 5 V in this state, only the shift thyristor $T_{n+1}$ can be turned on out of the shift thyristors T connected to the transfer signal line to which the transfer signal $\Phi1$ is supplied. In this state, the shift thyristor $T_n$ and the shift thyristor $T_{n+1}$ are in the on-state, and the gate potentials of the shift thyristors T on the right side of the shift thyristor $T_{n+1}$ decrease each by the diffusion potential. However, the power supply voltage VGK is 5 V, and the gate potential is limited by the power supply voltage VGK. Therefore, the gate potential is 5 V in the shift thyristors T on the right side of the shift thyristor $T_{n+5}$.

FIG. 7C illustrates a distribution of the potentials of the common gates $G_{n-1}$ to $G_{n+4}$ when the transfer signal $\Phi2$ is changed to 0 V from the state of FIG. 7B.

When the transfer signal $\Phi2$ is changed from 5 V to 0 V, the shift thyristor $T_n$ is turned off. Thereby, the potential of the common gate $G_n$ increases to the power supply voltage VGK.

In such a way, transfer of the on-state from the shift thyristor $T_n$ to the shift thyristor $T_{n+1}$ is completed.

Next, a light-emitting operation of the light-emitting thyristor L in the semiconductor light-emitting device according to the present embodiment will be described with reference to FIG. 6 to FIG. 8. In this example, the power supply voltage VGK supplied to the gate line is 5 V, and voltages of the transfer signals $\Phi1$ and $\Phi2$ supplied to the transfer signal lines and the lighting signals $\Phi W1$ to $\Phi W4$ supplied to the lighting signal lines are either 0 V or 5 V.

When the shift thyristor $T_n$ is in the on-state, the potential of the common gate $G_n$ is around 0.2 V as described above. Therefore, the threshold voltage of the light-emitting thyristors $L_{4n-3}$ to $L_{4n}$ connected to the common gate $G_n$ is 1.7 V. That is, if the lighting signals $\Phi W1$ to $\Phi$ having a voltage of 1.7 V or higher are supplied, the light-emitting thyristors $L_{4n-3}$ to $L_{4n}$ can emit light. Here, the lighting signals $\Phi W1$, $\Phi W2$, $\Phi W3$, and $\Phi W4$ correspond to the light-emitting thyristors $L_{4n-3}$, $L_{4n-2}$, $L_{4n-1}$, and $L_{4n}$, respectively. Therefore, the light-emitting thyristors $L_{4n-3}$, $L_{4n-2}$, $L_{4n-1}$, and $L_{4n}$ can be caused to emit light by any combination in accordance with a combination of the lighting signals $\Phi W1$, $\Phi$, $\Phi W3$, and $\Phi W4$.

When the potential of the common gate $G_n$ is 0.2 V, the potential of the adjacent common gate $G_{n+1}$ is 1.7 V, and the threshold voltage of the light-emitting thyristors $L_{4n+1}$ to $L_{4n+4}$ connected to the common gate $G_{n+1}$ is 3.2 V. Since the lighting signals $\Phi W1$ to $\Phi W4$ are at 5 V, it appears that the light-emitting thyristors $L_{4n+1}$ to $L_{4n+4}$ emit light at the same time as lighting drive of the light-emitting thyristors $L_{4n-3}$ to $L_{4n}$.

However, since the threshold voltages of the light-emitting thyristors $L_{4n-3}$ to $L_{4n}$ are lower than the threshold voltages of the light-emitting thyristors $L_{4n+1}$ to $L_{4n+4}$, the light-emitting thyristors $L_{4n-3}$ to $L_{4n}$ are turned on earlier than the light-emitting thyristors $L_{4n+1}$ to $L_{4n+4}$. Once the light-emitting thyristors $L_{4n+1}$ to $L_{4n+4}$ are turned on, the potential of the lighting signal line connected to the turned-on light-emitting thyristors $L_{4n+1}$ to $L_{4n+4}$ decreases to 1.5 V corresponding to the diffusion potential. As a result, the potential of the lighting signal line of interest becomes lower than the threshold voltage of the light-emitting thyristors $L_{4n+1}$ to $L_{4n+4}$, and the light-emitting thyristors $L_{4n+1}$ to $L_{4n+4}$ are not turned on.

Figure 8:
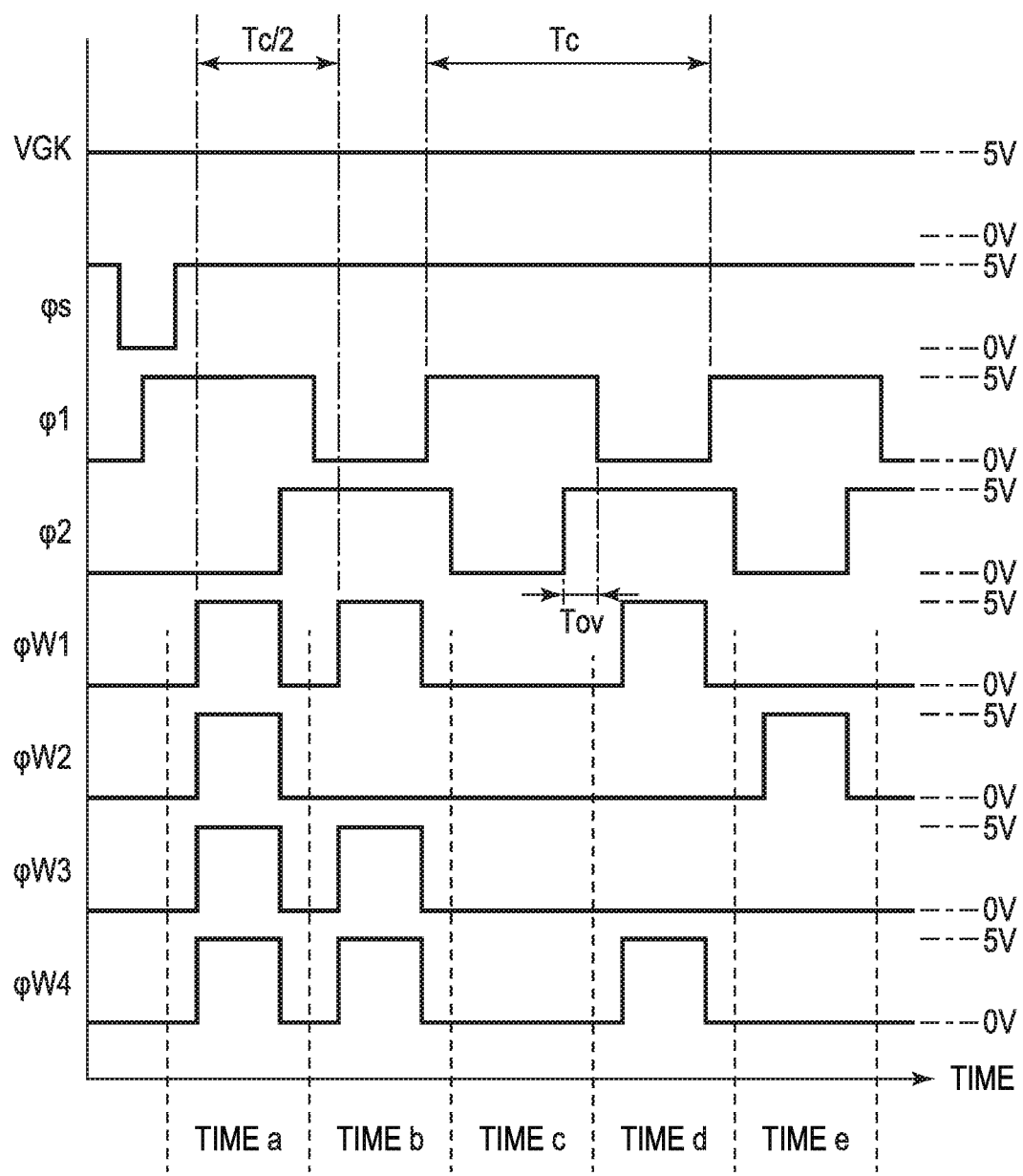
FIG. 8 is a timing diagram illustrating a method of driving the semiconductor light-emitting device according to the fifth embodiment of the present invention.

FIG. 8 is a timing diagram illustrating one example of a method of driving the semiconductor light-emitting device according to the present embodiment. FIG. 8 illustrates the power supply voltage VGK, the start signal $\Phi s$, the transfer signals $\Phi 1$ and $\Phi 2$, and the lighting signals $\Phi W1$, $\Phi W2$, $\Phi W3$, and $\Phi W4$. The transfer signal $\Phi 1$ is a clock signal used for the odd-numbered shift thyristors T, and the transfer signal $\Phi 2$ is a clock signal used for the even-numbered shift thyristors T.

First, the start signal $\Phi s$ is changed from 5 V to 0 V. Thereby, the potential of the common gate G connected to the gate of the shift thyristor T that is closest to the input side of the start signal $\Phi s$ (for example, the common gate $G_{n-1}$) decreases from 5 V to 1.7 V, and the threshold voltage of the shift thyristor $T_{n-1}$ is 3.2 V. Thereby, the shift thyristor $T_{n-1}$ is ready to be turned on by the transfer signal $\Phi 1$.

Next, the transfer signal $\Phi 1$ is changed from 0 V to 5 V to turn on the shift thyristor $T_{n-1}$. Further, slightly after the shift thyristor $T_{n-1}$ is turned on, the start signal $\Phi s$ is changed from 0 V to 5 V. The start signal $\Phi s$ remains at 5 V until the start timing of the next lighting operation.

The transfer signal $\Phi 1$ is the clock signal used for the odd-numbered shift thyristors T and has periodic pulses rising from 0 V to 5 V in a cycle Tc. The transfer signal $\Phi 2$ is a clock signal used for the even-numbered shift thyristors T and has periodic pulses rising from 0 V to 5 V at the same cycle Tc as the transfer signal $\Phi 1$. The transfer signal $\Phi 1$ and the transfer signal $\Phi 2$ are signals of approximately opposite phases but are configured to have a period Tov in which the on-states (periods of 5V) of both the transfer signals are overlapped after a rising edge and before a falling edge of each pulse.

The lighting signals $\Phi W1$, $\Phi W2$, $\Phi W3$, and $\Phi W4$ are transmitted in a half the cycle of the transfer signals $\Phi 1$ and $\Phi 2$ (Tc/2). If the lighting signal $\Phi W$ of 5 V is applied when the shift thyristor T is in the on-state, the light-emitting thyristor L corresponding to the lighting signal $\Phi W$ that has transitioned to 5V emits light.

For example, at time a, out of four light-emitting thyristors L connected to the same shift thyristor T (for example, the shift thyristor $T_{n-1}$), four light-emitting thyristors L corresponding to the lighting signals $\Phi W1$, $\Phi W2$, $\Phi W3$, and $\Phi W4$ emit light at the same time. Further, at time b, out of four light-emitting thyristors L connected to the same shift thyristor T (for example, the shift thyristor $T_n$), three light-emitting thyristors L corresponding to the lighting signals $\Phi W1$, $\Phi W3$, and $\Phi W4$ emit light at the same time. Further, at time c, all the lighting signals $\Phi W1$, $\Phi W2$, $\Phi W3$, and $\Phi W4$ are at 0 V, and all the light-emitting thyristors L are thus in the turn-off state. Further, at time d, out of four light-emitting thyristors L connected to the same shift thyristor T (for example, the shift thyristor $T_{n+2}$ (not illustrated)), two light-emitting thyristors L corresponding to the lighting signals $\Phi W1$ and $\Phi W4$ emit light at the same time. Further, at time e, out of four light-emitting thyristors L connected to the same shift thyristor T (for example, the shift thyristor $T_{n+3}$), only the light-emitting thyristor L corresponding to the lighting signal $\Phi W2$ emits light.

As described above, according to the present embodiment, by using the semiconductor light-emitting device according to the first to fourth embodiments, the self-scanning semiconductor light-emitting device that has high heat dissipation and high reliability can be realized.

Sixth Embodiment

Figure 9:
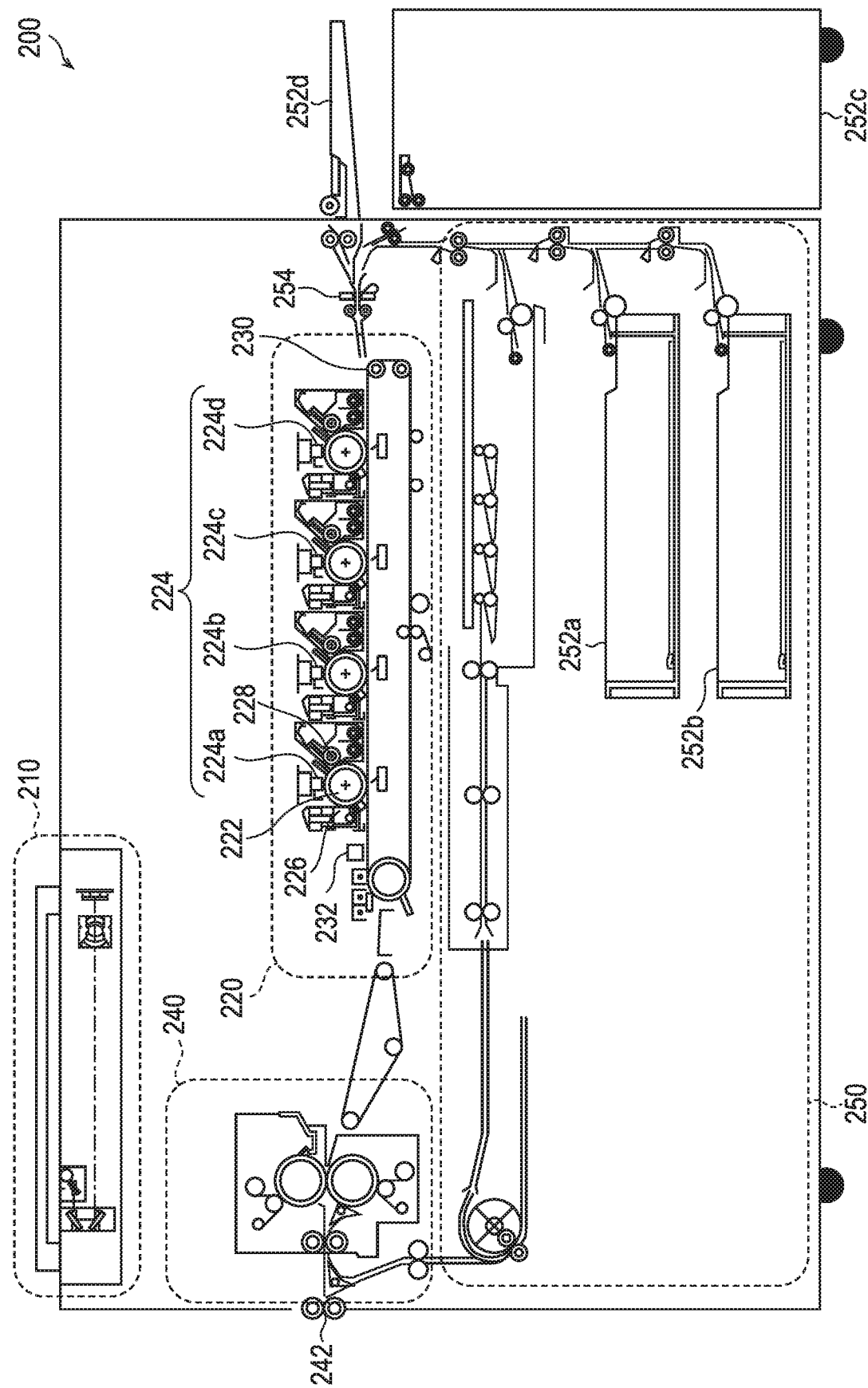
FIG. 9 is a schematic diagram illustrating a configuration example of an image forming apparatus according to a sixth embodiment of the present invention.
Figure 10A:
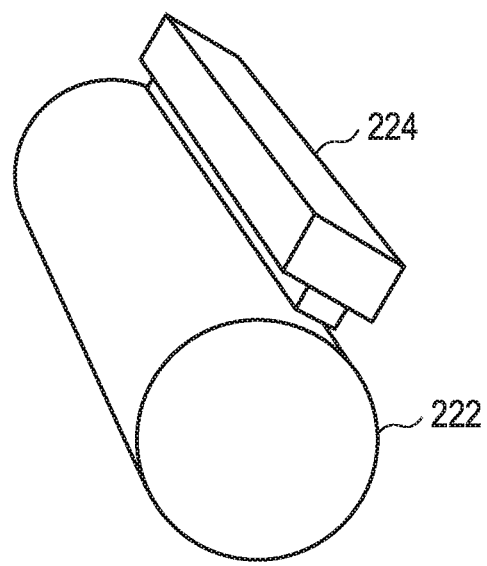
FIG. 10A and FIG. 10B are schematic diagrams illustrating a configuration example of an exposure head of an image forming apparatus according to the sixth embodiment of the present invention.
Figure 10B:
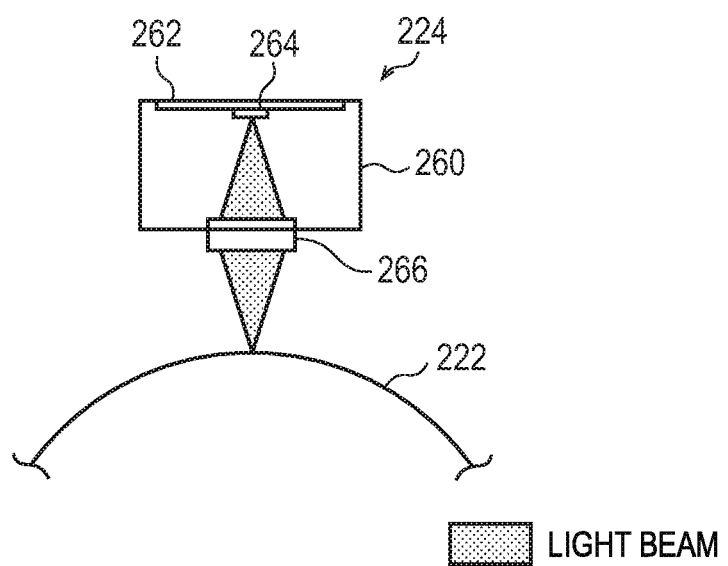
Figure 11A:
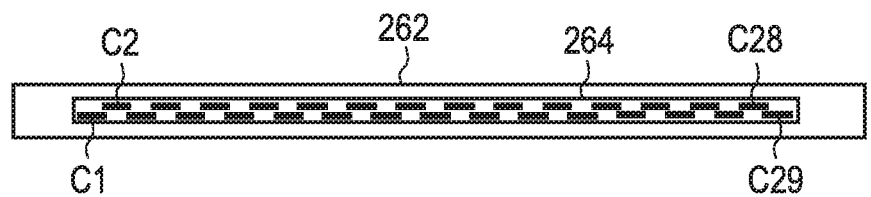
FIG. 11A, FIG. 11B, and FIG. 11C are schematic diagrams illustrating a surface light-emitting element array chip group of the image forming apparatus according to the sixth embodiment of the present invention.
Figure 11B:
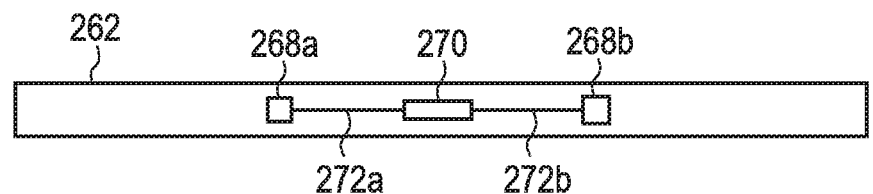
Figure 11C:
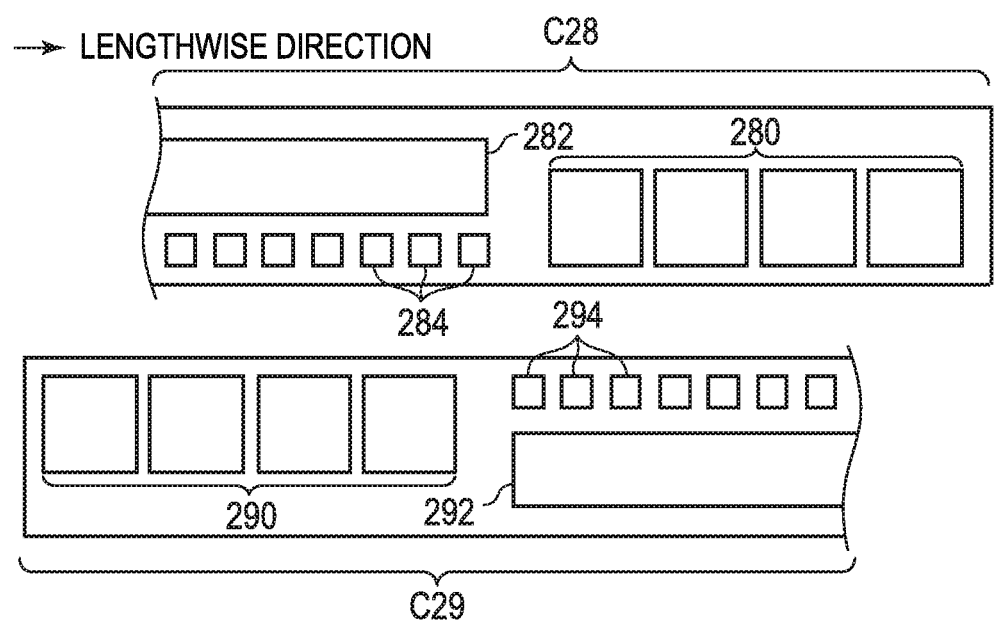

An image forming apparatus according to a sixth embodiment of the present invention will be described with reference to FIG. 9 to FIG. 11C. The same components as those of the semiconductor light-emitting device according to the first to fifth embodiments are labeled with the same references, and the description thereof will be omitted or simplified. FIG. 9 is a schematic diagram illustrating a configuration example of the image forming apparatus according to the present embodiment. FIG. 10A and FIG. 10B are schematic diagrams illustrating a configuration example of an exposure head of the image forming apparatus according to the present embodiment. FIG. 11A to FIG. 11C are schematic diagrams illustrating a surface light-emitting element array chip group of the image forming apparatus according to the present embodiment.

The semiconductor light-emitting device 100 described as the fifth embodiment is applicable to image forming apparatus such as an image scanner, a copy machine, a fax machine, or the like, for example. In the present embodiment, an electrophotographic image forming apparatus will be described as one example of an electronic apparatus using the semiconductor light-emitting device 100 of the fifth embodiment.

As illustrated in FIG. 9, an image forming apparatus 200 according to the present embodiment includes a scanner unit 210, an imaging unit 220, a fixing unit 240, a sheet feed/transport unit 250, and an image forming control unit (not illustrated) that controls these components.

The scanner unit 210 emits lighting to a document placed on a document stage to optically read an image of the document and converts the image into an electrical signal to create image data.

The imaging unit 220 includes a plurality of development units that perform development by using an electrophotographic process. Each development unit includes a photosensitive drum 222, an exposure head 224, a charger 226, and a developer 228. The development unit may be a process cartridge accommodating a configuration used for development of a toner image. In such a case, it is preferable that the process cartridge be removable with respect to the main body of the image forming apparatus.

The photosensitive drum 222 is an image carrier on which an electrostatic latent image is formed. The photosensitive drum 222 is rotary-driven and charged by the charger 226.

The exposure head 224 irradiates the photosensitive drum 222 with a light in accordance with the image data and forms an electrostatic latent image on the photosensitive drum 222.

The developer 228 supplies a toner (development agent) to an electrostatic latent image formed on the photosensitive drum 222 to perform development. The toner is accommodated in an accommodation unit. It is preferable that the accommodation unit accommodating a toner be included in the development unit. The developed toner image (development agent image) is transferred on a recording medium such as a sheet transported on a transfer belt 230.

The image forming apparatus of the present embodiment includes four development units (development stations) that perform development by using a series of electrophotographic processes and forms a desired image by transferring a toner image from each development unit. The four development units have respective toners of different colors. Specifically, four development units aligned in the order of cyan (C), magenta (M), yellow (Y), and black (K) sequentially perform imaging operations with magenta, yellow, and black after a predetermined period elapses from start of an imaging operation with cyan.

The sheet feed/transport unit 250 feeds a sheet from a sheet feed unit which is instructed in advance out of in-housing sheet feed units 252a and 252b, an external sheet feed unit 252c, and a bypass sheet feed unit 252d. A fed sheet is transported to a registration roller 254.

The registration roller 254 transports a sheet on the transfer belt 230 so that a toner image formed in the imaging unit 220 described above is transferred on the sheet.

An optical sensor 232 is arranged so as to face a face on which a toner image of the transfer belt 230 is transferred and performs position detection of a test chart printed on the transfer belt 230 in order to calculate a color displacement between development units. The color displacement calculated here is transmitted to an image controller unit (not illustrated) and used for correction of an image position of each color. This control enables a full-color toner image without color displacement to be transferred on a sheet.

The fixing unit 240 incorporates a plurality of rollers and a heat source such as a halogen heater, uses heat and pressure to dissolve and fix a toner on a sheet on which a toner image has been transferred from the transfer belt 230, and discharges the sheet out of the image forming apparatus 200 by using a sheet discharge roller 242.

The image forming control unit (not illustrated) is connected to a multifunction printer (MFP) control unit that controls the overall MFP including the image forming apparatus and performs control in accordance with an instruction from the MFP control unit. Further, the image forming control unit provides an instruction so that the entirety can maintain coordination to smoothly operate while managing the states of the scanner unit 210, the imaging unit 220, the fixing unit 240, and the sheet feed/transport unit 250 described above.

The exposure head 224 of the image forming apparatus according to the present embodiment will be described with reference to FIG. 10A and FIG. 10B. FIG. 10A illustrates the arrangement of the exposure head 224 relative to the photosensitive drum 222. FIG. 10B illustrates a view in which a light from the exposure head 224 is captured on the surface of the photosensitive drum 222.

As illustrated in FIG. 10A, the exposure head 224 is arranged so as to face the photosensitive drum 222. Each of the exposure head 224 and the photosensitive drum 222 is attached to the image forming apparatus 200 by an attachment member (not illustrated) for use.

As illustrated in FIG. 10B, the exposure head 224 includes a surface light-emitting element array chip group 264, a printed circuit board 262 on which the surface light-emitting element array chip group 264 is implemented, and a rod lens array 266. Further, the exposure head 224 includes a housing (support member) 260 that supports the rod lens array 266 and the printed circuit board 262.

The rod lens array 266 is an optical system that collects light from the surface light-emitting element array chip group 264. The exposure head 224 collects a light generated from a chip surface of the surface light-emitting element array chip group 264 onto the photosensitive drum 222 by the rod lens array 266 and forms an electrostatic latent image in accordance with image data on the photosensitive drum 222.

It is preferable that the exposure head 224 be configured to perform focus adjustment and light amount adjustment at each spot so that an assembly and adjustment operation is performed for a single exposure head in a factory and a light collecting position is located at an appropriate position when attached to an image forming apparatus. Herein, the components are arranged such that the distance between the photosensitive drum 222 and the rod lens array 266 and the distance between the rod lens array 266 and the surface light-emitting element array chip group 264 form predetermined gaps. Thereby, a light from the exposure head 224 is captured on the photosensitive drum 222. Thus, in focus adjustment, an attachment position of the rod lens array 266 is adjusted so that the distance between the rod lens array 266 and the surface light-emitting element array chip group 264 is a desired value. Further, in light amount adjustment, light-emitting points are sequentially caused to emit light, and the drive current at each light-emitting point is adjusted so that a light collected via the rod lens array 266 is a predetermined light amount.

The exposure head 224 of the present embodiment can be used preferably when exposure is performed on the photosensitive drum 222 to form an electrostatic latent image on the photosensitive drum 222. However, the use of the exposure head 224 is not particularly limited, and the exposure head 224 can also be used as a light source of a line scanner, for example.

The surface light-emitting element array chip group 264 of the image forming apparatus according to the present embodiment will be described with reference to FIG. 11A to FIG. 11C. FIG. 11A to FIG. 11C are diagrams schematically illustrating the printed circuit board 262 on which the surface light-emitting element array chip group 264 is arranged.

FIG. 11A schematically illustrates a face of the printed circuit board 262 on which the surface light-emitting element array chip group 264 is arranged, and the face is a face on which the surface light-emitting element array chip group 264 is mounted (hereinafter, referred to as "surface light-emitting element array mounting face").

As illustrated in FIG. 11A, the surface light-emitting element array chip group 264 is formed of 29 surface light-emitting element array chips C1 to C29 in this example. The surface light-emitting element array chip group 264 is mounted on the surface light-emitting element array mounting face of the printed circuit board 262. The surface light-emitting element array chips C1 to C29 are arranged in two lines in a staggered manner on the printed circuit board 262. Each line of the surface light-emitting element array chips C1 to C29 is arranged along the longitudinal direction of the printed circuit board 262.

Each of the surface light-emitting element array chips C1 to C29 may be formed of the semiconductor light-emitting device 100 disclosed in the fifth embodiment. Each of the surface light-emitting element array chips C1 to C29 has 516 light-emitting points and 516 light-emitting thyristors L corresponding to respective light-emitting points. In each of the surface light-emitting element array chips C1 to C29, the 516 light-emitting thyristors L are aligned one-dimensionally at a predetermined pitch in the longitudinal direction of the chip. Adjacent light-emitting thyristors L are isolated by an element isolation groove. That is, the surface light-emitting element array chips C1 to C29 can be referred to as a light-emitting thyristor array in which a plurality of light-emitting thyristors L are aligned one-dimensionally. In this example, the pitch between adjacent light-emitting thyristors is 21.16 μm, which corresponds to the pitch of resolution of 1200 dpi. Further, the distance between both ends of the 516 light-emitting points in the chip is around 10.9 mm 21.16 μm×516).

FIG. 11B is a diagram schematically illustrating a face of the printed circuit board 262 on the opposite side of the surface light-emitting element array mounting face (hereinafter, referred to as "surface light-emitting element array non-mounting face").

As illustrated in FIG. 11B, a drive unit 268a that drives the surface light-emitting element array chips C1 to C15 and a drive unit 268b that drives the surface light-emitting element array chips C16 to C29 are arranged on both sides of a connector 270 on the surface light-emitting element array non-mounting face. Signal lines that control the drive units 268a and 268b from an image controller unit (not illustrated), a power source, and a ground line are connected to the connector 270. Further, the drive units 268a and 268b on the surface light-emitting element array non-mounting face are connected to the connector 270 via wirings 272a and 272b, respectively. Wirings used for driving the surface light-emitting element array chips pass through an internal layer of the printed circuit board 262 from the drive units 268a and 268b and are connected to the surface light-emitting element array chips C1 to C15 and the surface light-emitting element array chips C16 to C29, respectively.

FIG. 11C illustrates a view of the boundary part between the surface light-emitting element array chip C28 and the surface light-emitting element array chip C29.

Wire bonding pads 280 and 290 used for inputting control signals are arranged at the ends of the surface light-emitting element array chips C28 and C29, respectively. Transfer units 282 and 292 of the surface light-emitting element array chips C28 and C29 and the light-emitting thyristors 284 and 294 are driven by signals input from the wire bonding pads 280 and 290, respectively. Also, in the boundary part between the surface light-emitting element array chips, the pitch in the longitudinal direction of the light-emitting thyristors 284 and 294 is 21.16 μm corresponding to the pitch of resolution of 1200 dpi.

Since the 29 surface light-emitting element array chips C1 to C29 having 516 light-emitting points per chip are aligned on the printed circuit board 262, the number of light-emitting thyristors L that can be caused to emit light is 14,964 in the overall surface light-emitting element array chip group 264. Further, the width where exposure is made by the surface light-emitting element array chip group 264 of this example is around 316 mm (≅10.9 mm×29). With a use of the exposure head on which the surface light-emitting element array chip group 264 is mounted, it is possible to form an image corresponding to such a width.

In the image forming apparatus of the present embodiment, since the number of components to be used is small, this facilitates reduction in size or reduction in cost of the apparatus compared to a laser scanning type image forming apparatus that polarizes and scans a laser beam by using a polygon motor.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, in the above embodiments, while an electrode structure arranged on the light-emitting face side of a surface light-emitting type light-emitting thyristor has been described, the present invention can be widely applied not only to a surface light-emitting type light-emitting thyristor but also to a surface light-emitting type semiconductor light-emitting device having a transparent electrode on the light-emitting face side. For example, the semiconductor light-emitting device may be a light-emitting diode or may be a semiconductor laser.

Further, in the above embodiments, GaAs-based compound semiconductor materials containing at least Ga as a group III element and at least As as a group V element have been illustrated as an example for group III-V compound semiconductors forming the semiconductor light-emitting device. However, an InP-based compound semiconductor material containing at least In as a group III element and at least P as a group V element may be used as a group III-V compound semiconductors forming the semiconductor light-emitting device. Further, not only a group III-V compound semiconductor but also a group IV semiconductor or a group II-VI compound semiconductor may be used to form the semiconductor light-emitting device. Further, the composition, the thickness, the impurity concentration, or the like of a material forming the semiconductor layer described in the above embodiments are preferable examples and can be changed as appropriate.

Further, in the semiconductor light-emitting device according to the above first to fourth embodiments, to increase light emission efficiency of the light-emitting thyristor, the semiconductor layer 32 or the semiconductor layer 34 that is to be a light-emitting portion may be of the multi-quantum well (MQW) structure.

Further, although four light-emitting thyristors L are connected to one shift thyristor T and the four light-emitting thyristors L are enabled to simultaneously emit light in the above fifth embodiment, the number of light-emitting thyristors L enabled to simultaneously emit light is not limited to four.

Further, although the shift thyristor T and the light-emitting thyristor L have been mainly described with an example of n-gate type thyristors in the above fifth embodiment, these thyristors may be formed of p-gate type thyristors. In such a case, the conductivity types of respective semiconductor layers forming the shift thyristor T, the light-emitting thyristor L, and the transfer diode D are opposite.

Further, the image forming apparatus illustrated in the above sixth embodiment is an example of an image forming apparatus to which the semiconductor light-emitting device of the present invention may be applied, and image forming apparatuses to which the semiconductor light-emitting device of the present invention is applicable are not limited to the configuration illustrated in FIG. 9. Further, the semiconductor light-emitting device of the present invention is applicable to various electronic apparatuses using a semiconductor light-emitting device without being limited to the image forming apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-070387, filed Apr. 2, 2019, which is hereby incorporated by reference herein in its entirety.

What is claimed is:

1. A semiconductor light-emitting device comprising:
a semiconductor stacked structure in which a first semiconductor layer of a first conductivity type, a second semiconductor layer of a second conductivity type opposite to the first conductivity type, a third semiconductor layer of the first conductivity type, and a fourth semiconductor layer of the second conductivity type are stacked in this order, the semiconductor stacked structure including a light-emitting layer;
a metal electrode provided over the semiconductor stacked structure; and
a transparent electrode provided over the semiconductor stacked structure and over the metal electrode,
wherein the fourth semiconductor layer includes a first layer having a first impurity concentration and a second layer as a contact layer having a second impurity concentration higher than the first impurity concentration, and
wherein the metal electrode is provided so as to surround a circumference of the second layer in a plan view.

2. The semiconductor light-emitting device according to claim 1, further comprising an insulating layer provided between the semiconductor stacked structure and the metal electrode.

3. The semiconductor light-emitting device according to claim 2, further comprising an adhesion layer provided between the metal electrode and the transparent electrode.

4. The semiconductor light-emitting device according to claim 3, wherein the adhesion layer contains a metal selected from Ti, Cr, and Ni, an alloy of metals selected from at least two of Ti, Cr, and Ni, an oxide of the metal, or an oxide of the alloy.

5. The semiconductor light-emitting device according to claim 2, further comprising a plurality of nodes each connected to a gate of a shift thyristor and a gate of a light-emitting thyristor and a plurality of transfer diodes connected between the plurality of nodes,
wherein each of the shift thyristor, the light-emitting thyristor, and the transfer diodes is formed of at least a part of the semiconductor stacked structure.

6. The semiconductor light-emitting device according to claim 1, wherein the second layer is in contact with the transparent electrode,
wherein a size of the second layer is smaller than a size of the first layer in the plan view, and
wherein the metal electrode overlaps with the first layer in the plan view.

7. The semiconductor light-emitting device according to claim 6, further comprising an insulating layer provided between the first layer and the metal electrode and over the second layer,
wherein the insulating layer has an opening above the second layer, and a size of the opening is smaller than a size of the second layer in the plan view.

8. The semiconductor light-emitting device according to claim 7, further comprising a plurality of nodes each connected to a gate of a shift thyristor and a gate of a light-emitting thyristor and a plurality of transfer diodes connected between the plurality of nodes,
wherein each of the shift thyristor, the light-emitting thyristor, and the transfer diodes is formed of at least a part of the semiconductor stacked structure.

9. The semiconductor light-emitting device according to claim 6, further comprising an adhesion layer provided between the metal electrode and the transparent electrode.

10. The semiconductor light-emitting device according to claim 9, wherein the adhesion layer contains a metal selected from Ti, Cr, and Ni, an alloy of metals selected from at least two of Ti, Cr, and Ni, an oxide of the metal, or an oxide of the alloy.

11. The semiconductor light-emitting device according to claim 6, further comprising a plurality of nodes each connected to a gate of a shift thyristor and a gate of a light-emitting thyristor and a plurality of transfer diodes connected between the plurality of nodes,
wherein each of the shift thyristor, the light-emitting thyristor, and the transfer diodes is formed of at least a part of the semiconductor stacked structure.

12. The semiconductor light-emitting device according to claim 1, further comprising an adhesion layer provided between the metal electrode and the transparent electrode.

13. The semiconductor light-emitting device according to claim 12, wherein the adhesion layer contains a metal selected from Ti, Cr, and Ni, an alloy of metals selected from at least two of Ti, Cr, and Ni, an oxide of the metal, or an oxide of the alloy.

14. The semiconductor light-emitting device according to claim 12, further comprising a plurality of nodes each connected to a gate of a shift thyristor and a gate of a light-emitting thyristor and a plurality of transfer diodes connected between the plurality of nodes,
wherein each of the shift thyristor, the light-emitting thyristor, and the transfer diodes is formed of at least a part of the semiconductor stacked structure.

15. The semiconductor light-emitting device according to claim 1, wherein the semiconductor stacked structure includes a thyristor structure.

16. The semiconductor light-emitting device according to claim 1, further comprising a plurality of nodes each connected to a gate of a shift thyristor and a gate of a light-emitting thyristor and a plurality of transfer diodes connected between the plurality of nodes, wherein each of the shift thyristor, the light-emitting thyristor, and the transfer diodes is formed of at least a part of the semiconductor stacked structure.

17. An exposure head comprising:
the semiconductor light-emitting device according to claim 1; and
an optical system that collects a light from the semiconductor light-emitting device.

18. An image forming apparatus comprising:
an image carrier;
a charging unit that charges a surface of the image carrier;
an exposure head that includes the semiconductor light-emitting device according to claim 1 and exposes a surface of the image carrier charged by the charging unit to form an electrostatic latent image on the surface of the image carrier;
a development unit that develops the electrostatic latent image formed by the exposure head; and
a transfer unit that transfers an image developed by the development unit onto a recording medium.

19. The semiconductor light-emitting device according to claim 1, wherein the metal electrode has a ring-shaped pattern in the plan view.

20. The semiconductor light-emitting device according to claim 1, wherein the metal electrode has a frame-shaped pattern in the plan view.

* * * * *